(12) United States Patent
Faris (10) Patent No.: US 7,075,104 B2
(45) Date of Patent: Jul. 11, 2006

(54) MICROCHANNEL PLATES AND BIOCHIP ARRAYS, AND METHODS OF MAKING SAME

(75) Inventor: Sadeg M. Faris, Pleasantville, NY (US)

(73) Assignee: Reveo, Inc., Elmsford, NY (US)

( * ) Notice: Subject to any disclaimer, the term of this patent is extended or adjusted under 35 U.S.C. 154(b) by 0 days.

(21) Appl. No.: 10/800,148

(22) Filed: Mar. 12, 2004

(65) Prior Publication Data
US 2004/0245521 A1    Dec. 9, 2004

Related U.S. Application Data

(63) Continuation-in-part of application No. 09/950,909, filed on Sep. 12, 2001.

(51) Int. Cl.
*H01L 35/24* (2006.01)

(52) U.S. Cl. .............. 257/40; 250/370.08; 250/370.01; 250/370.06; 250/370.09; 250/370.11

(58) Field of Classification Search ........... 250/370.08, 250/370.01, 370.09, 370.11
See application file for complete search history.

(56) References Cited

U.S. PATENT DOCUMENTS 6,362,482 B1 *   3/2002   Stettner et al. ........ 250/370.08

* cited by examiner

*Primary Examiner*—Mai-Huong Tran (57) ABSTRACT

A novel method of manufactring a microchannel plate ("MCP") is disclosed. The method comprises the steps of ion implantation of a substrate, the subsequent formation of channels paterned on the surface of the substrate and bonding of the subsequent substrate to a handle wafer. The layers are subsequently cleaved and the steps repeated until a MCP structure is achieved. The resulting MCP structure is cost-effective as compared to conventional manufacturing processes and the resulting MCP structure exhibits a funneling effect. The MCP structure may also be used for optical signal amplification for a biochip array.

4 Claims, 8 Drawing Sheets

H2+ implantation (a) ion implantation

(b) patterning, oxidation and gain enhancement layer coating of the ion implanted wafer (c) Wafer bonding (d) Cleaving thin patterned and processed layer (e) formation of MCP structure by repeating step (a) to (d)

MICROCHANNEL PLATES AND BIOCHIP ARRAYS, AND METHODS OF MAKING SAME

CROSS-REFERENCE TO RELATED APPLICATIONS

This application is a continuation-in-part of and claims the benefit under 35 U.S.C. § 120 of copending U.S. patent application Ser. No. 09/950,909 filed on Sep. 12, 2001 entitled "Thin Films and Production Methods Thereof" which is herein incorporated by reference.

TECHNICAL FIELD

The present invention relates generally to microchannel plates ("MCP"), and more particularly, to a method of manufacturing microchannel plates and Biochip arrays in a more cost effective manner.

BACKGROUND ART

Image intensifier tubes are used in night/low light vision applications to amplify ambient light into a useful image. A typical image intensifier tube is a vacuum device, roughly cylindrical in shape, which generally includes a body, photocathode and faceplate, microchannel plate ("MCP"), and output optic and phosphor screen. Incoming photons are focused on the glass faceplate by external optics, and strike the photocathode which is bonded to the inside surface of the faceplate. The photocathode or cathode converts the photons to electrons, which are accelerated toward the input side or electron-receiving face of the MCP by an electric field. The MCP has many microchannels, each of which functions as an independent electron amplifier, and roughly corresponds to a pixel of a CRT. The amplified electron stream emanating from the output side or electron-discharge face of the MCP excites the phosphor screen and the resulting visible image is passed through the output optics to any additional external optics. The body holds these components in precise alignment, provides electrical connections, and also forms the vacuum envelope.

Conventional MCPs are formed from the fusion of a large number of glass fibers, each having an acid etchable glass core and one or more acid-resistant glass cladding layers, into a solid rod or boule. Individual plates are sliced transversely from the boule, polished, and chemically etched. The MCPs are then subjected first to a hydrochloric acid bath that removes the acid etchable core rod (decore), followed by a hot sodium hydroxide bath that removes mobile alkali metal ions from the glass cladding.

Detection and amplification of low-level image signals is a critical function in a wide variety of military and civilian applications. Many high-gain detectors, numerous types of photomultiplier tubes, and most image intensifier tubes incorporate MCPs as the primary amplifying device. The diverse fields in which MCP-based systems are used today include military uses (for e.g., night vision devices, weapon sights, aerospace vision systems) and scientific uses (for e.g., electron microscopes, fast oscilloscopes, X-ray images amplifiers, field-ion microscopes, time-correlated photon counters, quantum position detectors).

Additional applications of MCPs include astronomical uses (for e.g., grazing-incidence telescopes for soft X-ray astronomy, concave grating spectrometers for exploration of planetary atmospheres, laser satellite ranging systems), medical uses (for e.g., observation of low-level fluorescence and luminescence in living cells, radio luminescence imaging, correction of night blindness), and commercial uses (for e.g., night vision consumer products for security and law enforcement, search and rescue operations, outdoor sport and recreation).

Although ITT Night Vision, along with several other manufacturers, has recognized the strategic importance of moving towards new, dynamic markets and is branching into consumer products, the military market remains dominant. Prices well over $500 for a low-end night vision product constrain expansion into more cost-conscious, non-military markets. The commercial market for consumer products based on MCPs is currently very small, and night vision has remained an expensive luxury that is out of reach for most individuals.

The commercial sector of MCPs is hugely underdeveloped: if MCPs were available at reasonable prices, such as under $100, or even under $50, they could become the basis of a vast number of popular consumer products with market size in billions of dollars. From simple night vision goggles or glasses for night-time drivers (particularly the elderly and sight-impaired), hunters, boaters, night time divers, and even dog-walkers, to more advanced devices for search and rescue, night-time filming, CCTV surveillance and security systems, the range of possible applications is immense. A significant reduction in the price of MCPs is the only way to open up these huge, untapped markets.

Figure 1:
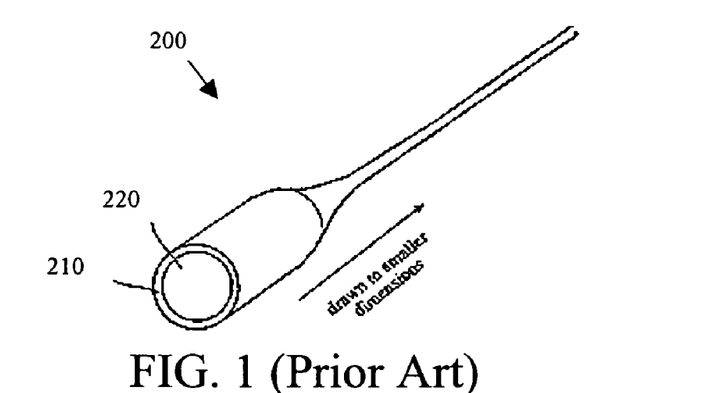
FIGS. 1–4 depict prior art process steps for manufacturing microchannel plates is primarily based of drawing glass fibers and fiber bundles.
Figure 2:
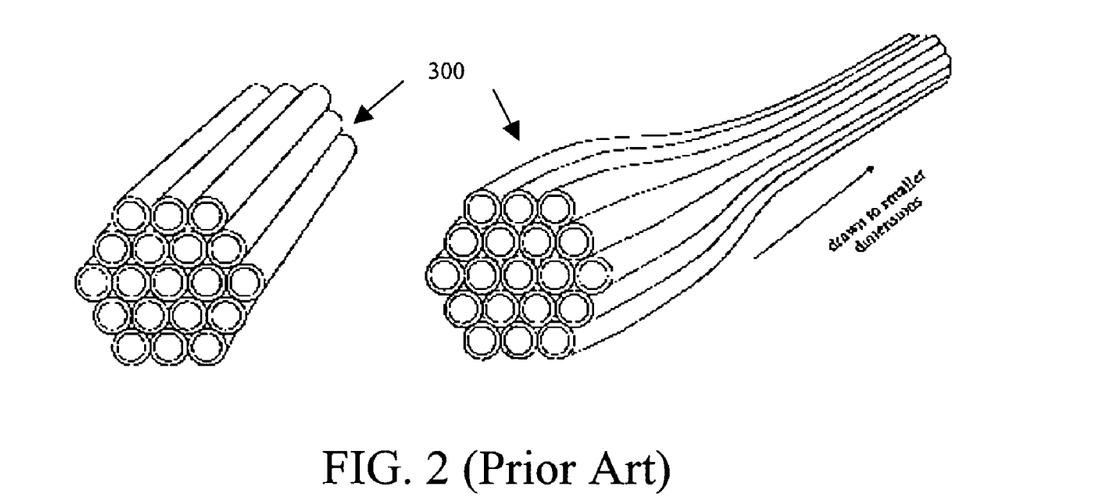
Figure 3:
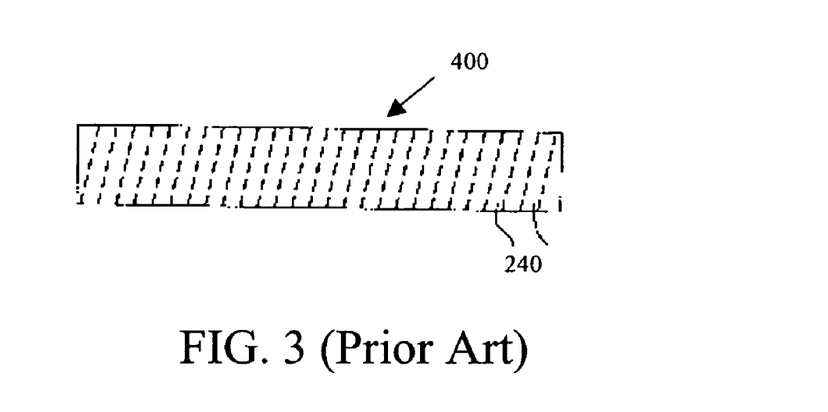

The current process used in industry for manufacturing microchannel plates is primarily based on the technology of drawing glass fibers and fiber bundles. Referring now to FIGS. 1–4, the multiple conventional processing steps required for manufacture of MCPs are illustrated. Referring to FIG. 1, there is shown the beginning step of the fabrication process. It will be understood that FIG. 1 is not drawn to scale, especially with regard to the longitudinal axis of the tube 200. The fabrication process begins with tubes 200 of specially formulated glass, usually lead oxide glass 210, that is optimized for secondary electron emission characteristics. Solid cores 220 of a second glass with a different etching characteristic are inserted into the tubes. The filled tubes are softened and drawn to form a fiber, as shown in FIG. 1. Referring to FIG. 2, the next fabrication step involves combining millions of such fibers together in a bundle 300 in a hexagonal close-packed arrangement. The bundle is fused together at a temperature of 500° C.–800° C. and again drawn out until the solid core diameters become approximately equal to the required channel diameter (40 to 10 μm, see FIG. 3). Referring to FIG. 3, individual microchannel plates 240 are cut from this billet 400 by slicing at the appropriate bias angle to the billet axis, as shown in FIG. 3. The thickness of the slice is generally chosen to give a channel length-to-diameter ratio of 40–80.

Figure 4:
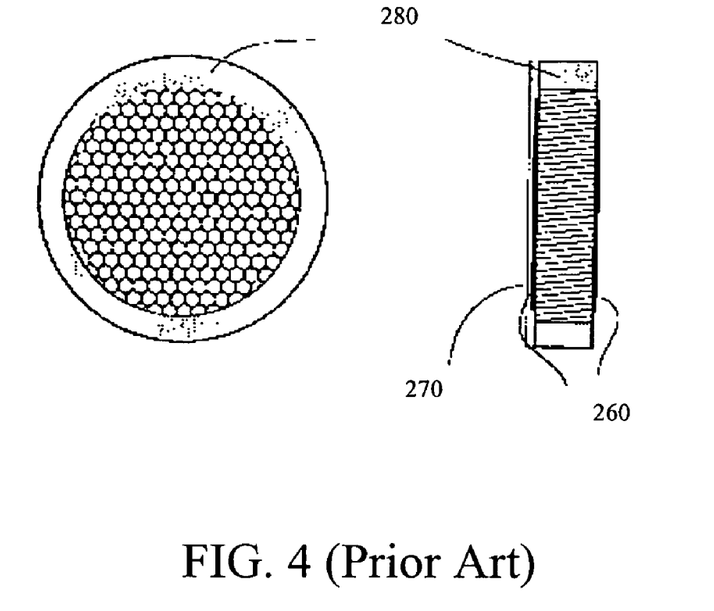

The individual plates are next ground and polished to an optical finish. The solid cores are removed by chemical etching in an etchant that does not attack the lead oxide glass walls, thus generating hollow channels through the plates. Further processing steps lead to the formation of a thin, slightly conducting layer beneath the electron-emissive surface of the channel walls. Referring to FIG. 4, there is shown a cross-section and side view of a resulting wafer of microchannel plates. Electrodes 260, in the form of thin metal films, deposited on both faces of the finished wafer. A thin membrane of $SiO_2$ (formed on a substrate which is subsequently removed) is deposited on the input face to serve as an ion-barrier film 270. Finally, the plate is secured in one of several different types of flange 280. The finished MCP may now be incorporated into an image-intensification system. As described, the process is very complex and very costly.

Figure 5:
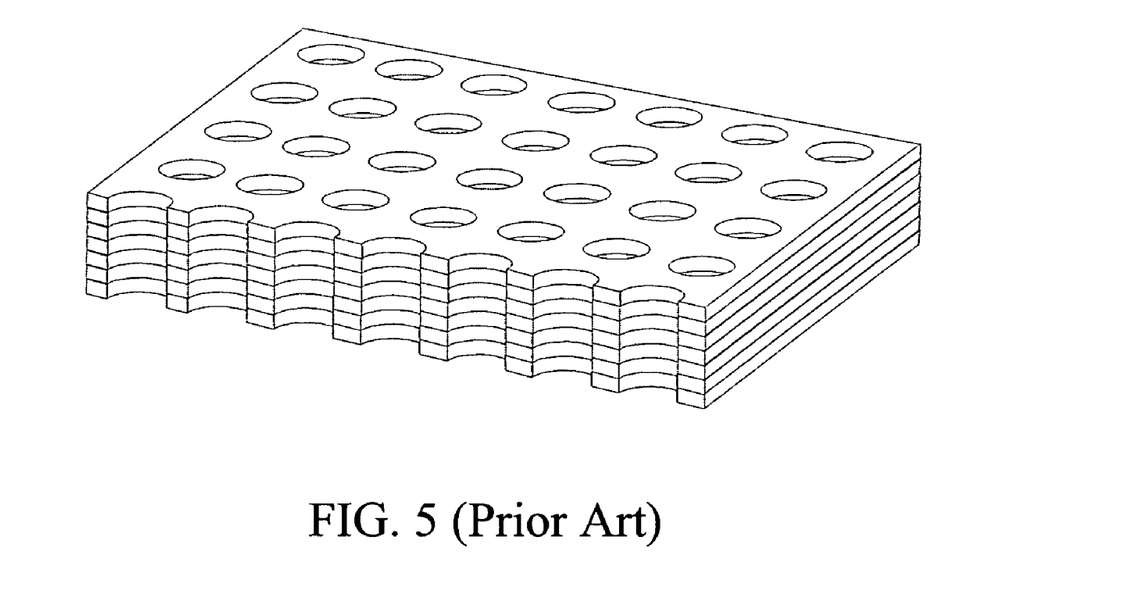
FIG. 5 shows a prior art green sheet MCP.

Current manufacturing technologies for MCP with materials other than glass also are known. Referring now to FIG. 5, one alternate method of manufacture of MCP with materials other than glass are shown. One of the methods invented to make MCPs with alternate material is by using materials called green sheets. Green sheets are made by first mixing polymer binder and powdered ceramic/glass. This slurry is then coated in sheet form and dried to form green sheets. In the described method, such green sheets were punctured with array of holes of the sizes to MCP tubes. Subsequently, the sheets were stacked on top of each other such that the holes punctured in each sheets align thus forming array of micro tubes, the structure needed for MCP. Subsequently, this whole structure is furnaced at a high temperature to make it solid. It is further processed to provide a gain-enhancing layer on MCP tube surfaces.

In silicon MCPs, an array of holes are etched in silicon wafer using different techniques such as electrochemical etching, reactive ion etching and streaming electron cyclotron resonance etching. This MCP structure in the silicon wafer is then oxidized to form $SiO_2$. It is further processed to provide a gain enhancing layer on channel walls and electrodes on both sides.

The above-described limitations of current MCP manufacturing technology must be overcome. With respect to materials used, very little flexibility is currently available. Constraints in the softening temperature and differential etching characteristics mean that only a few glasses can be used. The material must be doped appropriately to meet the constraints, resulting in the following adverse effects on performance: defects, impurities, nonuniformities, and residues from etching reduce the signal-to-noise ratio and increase energy dispersion. Additionally, low softening temperatures contribute to outgassing, and narrow material spectrum precludes the optimization of secondary emission by means of optimum surface treatment, leading to lower gain and lower saturation voltage.

Resolution depends on the diameter and pitch of the channels as well as the electron energy dispersion, the accelerating voltage, and the distance between the MCP output face and the phosphor surface. Typically, the secondary-electron beam width at the phosphor screen is three times the channel diameter, leading to a very low modulation transfer function ("MTF") and making focusing necessary. By fusing, drawing, and etching it is impossible or prohibitively expensive to make channel diameters below 4 μm and maintain an open area ratio above 50%. Previous generations of microchannel plates have MTFs well below unity (the ideal MTF is 1 at the channel array pitch) and no dramatic increase is expected from the conventional fiber-drawing technology. The following problems are related to reducing the channel diameter: the walls between the channels become too weak to withstand the subsequent processing steps, especially when the optimum MCP thickness is proportionally reduced to satisfy the constraint $L/d_c \sim 40$, which leads to poor yield and reduced useful area; etching of narrower channels becomes more difficult; the etching nonuniformity and spatial pattern nonuniformity lead to further increases in noise; the production of large, defect-free areas becomes more difficult; and the treatment of the channels to achieve funneling becomes more difficult.

For MCPs with very small pitch, the conventional manufacturing technology limits the useful area that can be achieved to about 1 square inch (approx. 6 $cm^2$), precluding applications requiring high resolution over large areas.

There have been some alternatives to current glass MCP manufacturing technology.

A method was developed for making a novel microchannel plate ("MCP") by introducing new materials and process technologies. The key features of their MCP were as follows: (i) bulk alumina as a substrate, (ii) the channel location defined by a programmed-hole puncher, (iii) thin film deposition by electroless plating and/or sol-gel process, and (iv) an easy fabrication process suitable for mass production and a large-sized MCP. Green sheets made up of alumina slurry in binder were punched with a hole puncher into array of holes. Later on many of these sheets were stacked on top of each other with their array of holes aligned to each other and were furnaced to form the MCP structure with circular holes of 170 microns with pitch if 220 microns and thickness of 2 mm. This MCP structure was further processed to make the final MCP structure. The characteristics of the resulting MCP were evaluated with a high input current source such as a continuous electron beam from an electron gun and Spindt-type field emitters to obtain information on electron multiplication. In the case of a 0.28 μA incident beam, the output current enhanced ~170 times, which is equal to 1% of the total bias current of the MCP at a given bias voltage of 2600 V. When the developers of the process inserted a MCP between the cathode and the anode of a field emission display panel, the brightness of luminescent light increased 3–4 times by multiplying the emitted electrons through pore arrays of a MCP. However, the sizes if the MCP structures made are not suitable for the typical image intensifier tubes.

There have also been other attempts to make MCP structure from GaAs and fused silica using micromachining techniques of dry etching. Etch methods used were magnetron reactive ion etching, chemically assisted ion beam etching ("CAIBE"), and electron cyclotron resonance etching ("ECR"). Extensive characterization of the ECR etcher was carried out with a designed experiment, which used statistical methods to minimize the number of characterization runs. CAIBE gave high aspect ratio etching of GaAs, but at low etch rates. ECR provided higher etch rates of GaAs and better substrate temperature control. The effect of temperature on sidewall roughness and undercut was examined for temperatures as low as −100° C. Features with an aspect ratio greater than 30 are obtained. Etching of fused silica was difficult due to low etch rates (<0.2 μm/min), and faceting of the metal mask.

Other developers have worked on a structure for microchannel plates fabricated using Si micromachining techniques. High aspect ratio pores were constructed using reactive ion etching and streaming electron cyclotron resonance etching, and low-pressure chemical vapor deposition ("LPCVD"). In one process, 40 μm deep pores with 2 μm openings on 4 μm centers were directly etched in Si. Alternatively, pores with aspect ratios of 30:1 were constructed in a low-stress $SiN_x$ membrane using a sacrificial template process whereby pillars of Si are etched and then subsequently backfilled with a dielectric using LPCVD. In these micromachining techniques there was no mention of making bias angle in the micro channels needed for the Chevron configuration of MCPs.

Another important technology was developed to make silicon MCPs. After defining a simple lithography step and pre-etch to define the starting channel geometry in a hexagonal pattern on Si wafer, the channels are etched with electrochemical etch. This etch follows the crystallographic plane thus providing any necessary bias angles to the microchannel structure. Typical channels of pitch 8 microns and depth of 350 microns were etched. Further this MCP structure was oxidized and processed to produce final MCP structure. This was characterized electrically to determine the gain of this MCP structure.

Another known method of manufacturing microchannel plates is described in Faris, et al. U.S. Pat. Nos. 5,265,327 and 5,565,729, both entitled "Microchannel Plate Technology," both of which are fully incorporated by reference herein.

The current manufacturing technology is inherently high-cost due to the numerous processing steps required. A 1-inch diameter MCP with 10 μm pitch has a cost in the range of $500–1000. Accordingly, there remains a need in the art for lower cost MCPs and manufacturing methods that will reduce the cost of MCPs.

SUMMARY OF THE INVENTION

The above-discussed and other problems and deficiencies of the prior art are overcome or alleviated, and the objects of the invention are attained, by the several methods and apparatus of the present invention.

In one aspect, the invention is a microchannel plate comprising: a plurality of laminated layers, each of said laminated layers having a plurality of channels formed therein, wherein the block is sliced to a specified plate thickness.

In another aspect, the invention is a method of manufacuting a microchannel plate structure on a substrate, said method comprising the steps of: selectively bonding a first layer to said substrate; forming channels in said first layer; attaching a handle to said first layer; and cleaving said substrate.

In another aspect, the invention is a method of manufacuting a microchannel plate structure comprising: providing a substrate; selectively creating strong bond regions and weak bond regions on said substrate; providing a first bonded layer and a substrate layer; forming channels in said first layer; attaching a handle to said first layer; cleaving said substrate; repeating said forming, attaching and cleaving steps for a second layer; and bonding said first layer to said second layer.

In another aspect, the invention is a Biochip array comprising: a CCD array; a phosphor screen supported by said CCD array; a micorchannel plate supported by said phosphor screen; a photocathode supported by said microchannel plate; and an array of biochips supported by said photocathode.

BRIEF DESCRIPTION OF THE DRAWINGS

The foregoing summary as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings, wherein.

DETAILED DESCRIPTION OF THE DRAWINGS

The present disclosure proposes new technologies for preparation of MCP. In both approaches the MCP structure is prepared by stacking a micro-patterned sheets to create the MCP structure. The method involves selectively bonding a useful layer on a support layer, patterning the useful layer, and readily removing the useful layer to derive a micro-patterned sheet.

These methods have advantaged over other known methods in that with the instant methods, a funnel like structure may be created in MCP to enhance its resolution. Further, the instant methods provide choice of various materials to be used for MCP structure and gain enhancement coatings.

This method has the further advantage over above technology in that better resolution can be achieved in comparison to silicon MCP where etching through narrow long channels becomes more and more difficult as higher resolutions are sought.

Further, the present disclosure provides a novel configuration of a MCP device (which may be fabricated according to the methods described herein or according to other methods), for example, useful in Biochip arrays.

The methods herein are a radical departure from convention. The conventional process is complicated, costly, and can only produce small plates. The methods herein involve simple lamination of pre-patterned sheets in a rapid process, which may be automated. This significantly reduces the number of steps required to produce a plate, thus lowering the manufacturing costs, and also allows for greater freedom in material choice, larger plate areas, and other performance enhancements.

It is envisioned that the $400 million night vision market will be transformed by the introduction of low-cost MCPs as described herein. Emerging consumer markets, currently restricted by the high cost of microchannel plates, will grow rapidly. The MCPs herein are projected to cost under $50 per square inch (compared with several hundreds of dollars for a standard microchannel plate) and will enable, for example, elderly drivers, search and rescue experts, and sports and nature enthusiasts alike to benefit from low-cost and effective night vision equipment.

Figure 6:
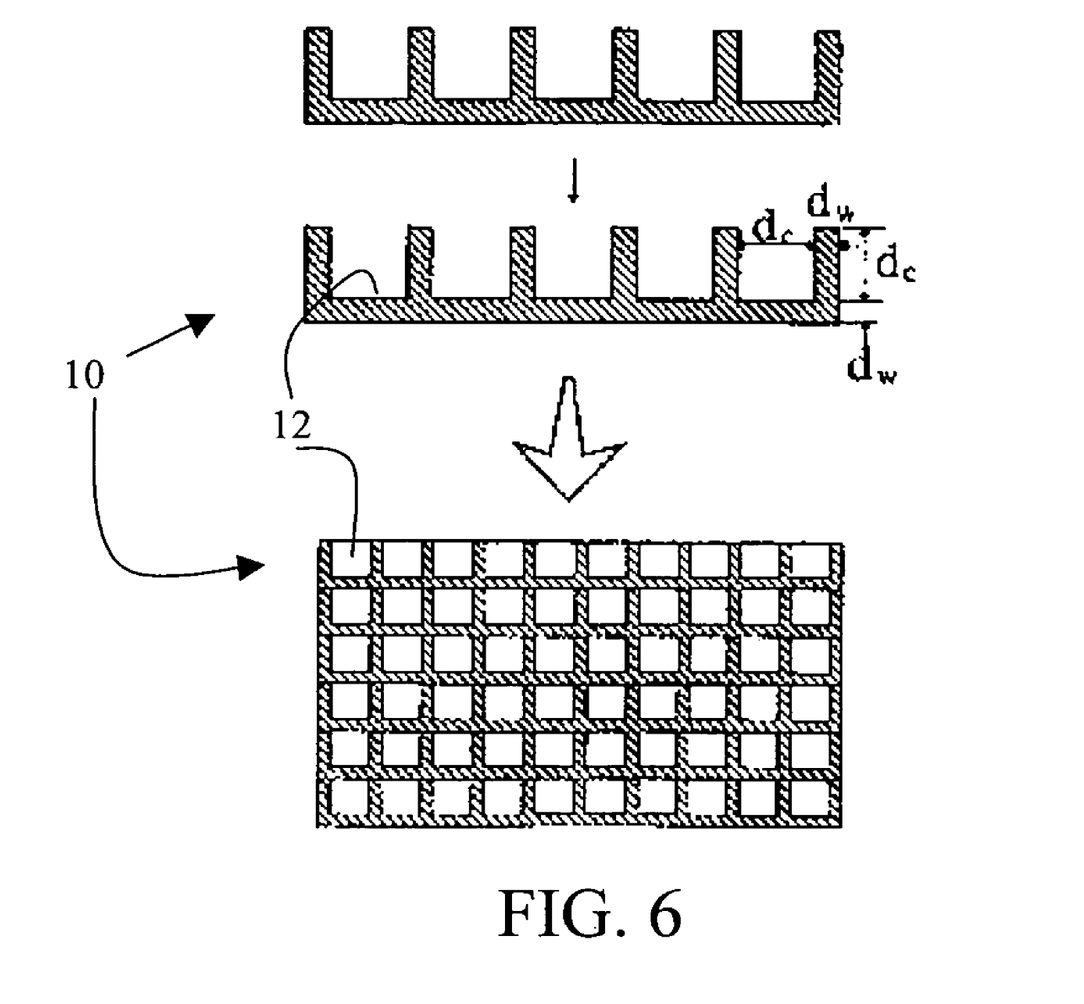
FIG. 6 shows an embodiment of an MCP structure of the present invention.

Referring now to FIG. 6, a schematic diagram of the MCP in accordance with the principles of the invention is shown. The MCP comprises a plurality of laminated or stacked layers 10, each layer having plural channels 12 formed therein, wherein the block formed by the plurality of laminated or stacked layers is sliced to provide a MCP of desired thickness.

In a preferred embodiment, the channels 12 are tapered, leading to a "funneling" effect. The "funneling" effect is a mechanism for fine focusing of the secondary electrons as they exit the channels, reducing the spatial overlap of electrons from adjacent channels and increasing the resolution of the MCP.

Generally, the MCPs of the present invention are manufactured by laminating plural layers. Channels 12 are formed in each layer 10, and plural layers 10 are aligned and laminated, generally as shown in FIG. 6. A block formed by the laminated structure may then be sliced to provide MCPs of desired dimensions and/or resolutions. In a preferred embodiment, low cost and high resolution Massive Fillo Leaf ("MFT") based MCP manufacturing methods may be used. The present method of manufacturing MCPs may be enhanced with the use of Applicant's multi-layered manufacturing methods, as described in U.S. patent application Ser. No. 09/950,909, filed Sep. 12, 2001 entitled "Thin films and Production Methods Thereof"; Ser. No. 10/222,439, filed Aug. 15, 2002 entitled "Mems And Method Of Manufacturing Mems"; Ser. No. 10/017,186 filed Dec. 7, 2001 entitled "Device And Method For Handling Fragile Objects, And Manufacturing Method Thereof"; and U.S. Provisional Application Ser. No. 60/428,125 filed Nov. 20, 2002 and entitled "Three Dimensional Device Assembly and Production Methods Thereof"; all of which are incorporated by reference herein.

Multi-layer devices can be fabricated on a selectively bonded multiple layer substrate is shown. The multiple layer substrate includes a layer having an exposed surface, and a surface selectively bonded to a surface of a layer. The layer further includes an opposing surface. In general, to form the selectively bonded multiple layer substrate, the first layer, second layer, or both layers are treated to define regions of weak bonding and strong bonding, and subsequently bonded, wherein the regions of weak bonding are in a condition to allow processing of a useful device or structure.

Generally, the two layers are compatible. That is, the layers constitute compatible thermal, mechanical, and/or crystalline properties. In certain preferred embodiments, layers are the same materials. Of course, different materials may be employed, but preferably selected for compatibility.

One or more regions of layer are defined to serve as the substrate region within or upon which one or more structures, such as microelectronics may be formed. These regions may be of any desired pattern, as described further herein. The selected regions of layer may then be treated to minimize bonding, forming the weak bond regions. Alternatively, corresponding regions of the second layer may be treated (in conjunction with treatment of the first layer, or instead of treatment to the first layer) to minimize bonding. Further alternatives include treating the first and/or the second layer in regions other than those selected to form the structures, so as to enhance the bond strength at the strong bond regions.

After treatment of the first layer and/or the second layer, the layers may be aligned and bonded. The bonding may be by any suitable method, as described further herein. Additionally, the alignment of the layers may be mechanical, optical, or a combination thereof. It should be understood that the alignment at this stage may not, be critical, insomuch as there are generally no structures formed on the layer. However, if both layers are treated, alignment may be required to minimize variation from the selected substrate regions.

The multiple layer substrate may be provided to a user for processing of any desired structure in or upon the first layer. Accordingly, the multiple layer substrate is formed such that the user may process any structure or device using conventional fabrication techniques, or other techniques that become known as the various related technologies develop. Certain fabrication techniques subject the substrate to extreme conditions, such as high temperatures, pressures, harsh chemicals, or a combination thereof. Thus, the multiple layer substrate is preferably formed so as to withstand these conditions.

Useful structures or devices may be formed in or upon regions of the substrate, which partially or substantially overlap weak bond regions. Accordingly, other regions may partially or substantially overlap strong bond regions and generally do not have structures therein or thereon. After a user has formed useful devices within or upon the first layer of the multiple layer substrate, the first layer may subsequently be debonded. The debonding may be by any known technique, such as peeling, without the need to directly subject the useful devices to detrimental delamination techniques. Since useful devices are not generally formed in or on weak bond regions, these regions may be subjected to debonding processing, such as ion implantation, without detriment to the structures formed in or on regions.

To form weak bond regions, surfaces of the multiple layer substrate may be treated at the locale of weak bond regions to form substantially no bonding or weak bonding. After treatment of one or both of the groups of weak bond regions and strong bond regions, the first two layers are bonded together to form a substantially integral multiple layer substrate. Thus, as formed, multiple layer substrate may be subjected to harsh environments by an end user, e.g., to form structures or devices therein or thereon, particularly in or on weak bond regions of the first layer.

Recent parallel developments in bonding and thinning of silicon wafers have created a new, enabling technology for the transfer of thin layers. Wafer bonding takes advantage of a phenomenon that lens makers have known for over one hundred years. That is, that surfaces which are very smooth, very flat and very clean can form Van der Waals bonds when placed into intimate contact, and that these bonds can be converted to strong, atomic bonds with annealing. This method of forming a bond without adhesive is generally known as fusion bonding. The surfaces of single crystal silicon wafers are nearly atomically smooth and hence are ideal for fusion bonding. It is now routine to bond semiconductor wafers to each other with a bond strength that equals the bulk mechanical properties, and commercial, automated cluster tools are available to prepare and bond wafer pairs. However, up until recently, if it was desired to bond a thin layer onto a wafer, as is done in some silicon-on-insulator ("SOI") manufacturing, the bulk of one of the bonded wafers had to be etched or mechanically polished away. This was a slow, expensive and tedious process.

A significant advance in thinning technology came with the announcement of the "Smart-Cut" process revealed in U.S. Pat. No. 5,374,564 to Bruel. Rather than grinding or etching the excess silicon, Bruel implanted hydrogen into a plane inside the wafer before bonding to create a plane of microcavities. After bonding the implanted wafer to an oxidized handle wafer, cleavage is propagated along the implant plane by applying heat or mechanical force. The cleavage generates an SOI wafer by splitting away the bulk of the implanted wafer, leaving a thin layer of single crystal silicon bonded to the oxidized handle wafer. The remainder of the wafer, which has been split off, is then re-used as the handle wafer for the next SOI wafer. The cleavage surface is remarkably smooth. To create an implant plane incised the silicon wafer, typical implant conditions for hydrogen are a dose of $5 \times 10^{16}$ cm$^{-2}$ and energy of 120 keV. For the above conditions, about 1 micron layer thickness can be cleaved from the wafer. The layer thickness is a function of the implant depth only, which for hydrogen in silicon is 90 Å/keV of implant energy.

The implantation of high energy particles heats the target significantly. Blistering must be avoided when implanting hydrogen by reducing beam currents by a factor of ½ or more, or by clamping and cooling the wafer. Splitting with lower hydrogen implant doses has been achieved with co-implantation of helium or boron (Smarter-Cut process). While this new, enabling technology has been commercialized to manufacture SOI wafers, there remain vast opportunities in 3-dimensional integration of microelectronics, in machining microelectromechanical devices, in optical devices and more.

Figure 7:
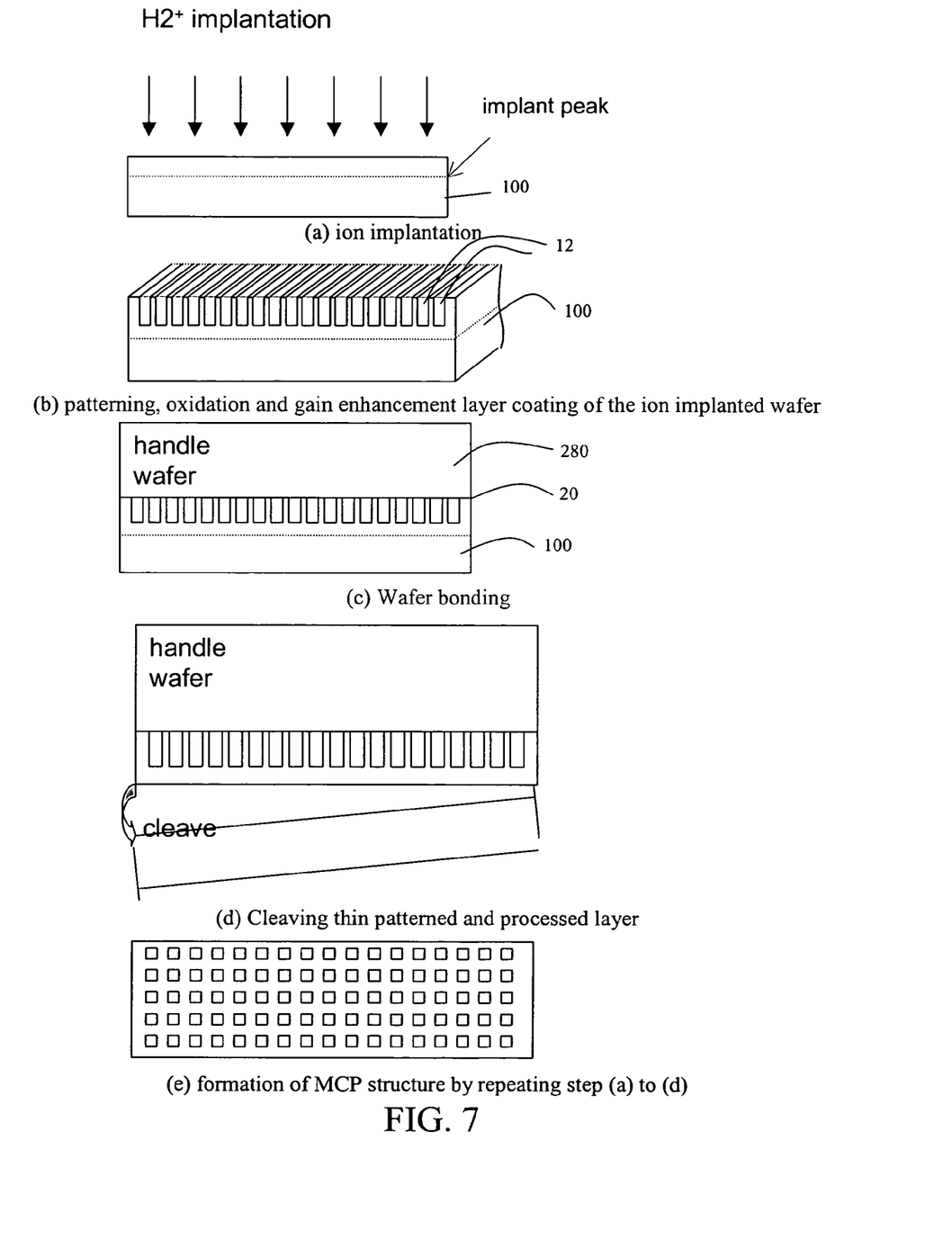
FIG. 7 shows another embodiment of a system and method for making an MCP structure of the present invention.

Referring to FIG. 7, there is shown generally the steps of the method of manufacturing the MCP in accordance with the principles of the invention. First, H2+ ions are implanted on to a wafer substrate 100. In a preferred embodiment, the ions are implanted via ion implantation. Second, patterning and oxidation of the substrate 100 is performed to form channels 12 on the substrate 100. A plurality of parallel channels are formed on the substrate 100. A gain enhancement layer (not shown) is coated on the wafer 100. A handle wafer 280 is subsequently fusion bonded to the substrate 100 via a fusion bond 20. Subsequently, layers are cleaved from the substrate 100. Repetition of the described steps can achieve the MCP structure as shown in FIG. 7(d).

In an alternative embodiment, the fabrication process is described with specific reference to the exact steps of FIG. 7. A silicon wafer 100 is ion implanted using the ion implantation process. Hydrogen is ion implanted through the oxide to form an internal cleavage plane. This wafer is to be patterned to form a array of parallel trenches using standard photolithography techniques. An anisotropic etch will be used to create square profile trenches. If necessary, an oxide or silicon nitride hardmask can be used as an etch mask. Wet chemical etches for silicon which are anisotropic with respect to crystallographic direction include KOH, EDP (ethylene diamine pyrocatechol), HF—H$_2$O$_2$, HF—NH$_4$F, and TMAH. Dry etch techniques are highly effective at generating anisotropic profiles. Deep, straight-walled trenches only 0.1 microns wide have been demonstrated using inductively coupled plasma etch through a nickel mask. The trenches may also be formed in a tapered manner, resulting in a structure similar to FIG. 11, with suitable etch control (e.g., by masking or other suitable etch control means for achieving the desired tapered shape).

A high temperature thermal oxidation will be used to line the trench walls with dense, high quality SiO$_2$. The wafer now has oxide-coated trenches. After a wet chemical surface treatment to improve hydrophilic nature of the oxide surface, the wafer is ready form the channels by bonding. Alternatively, a secondary electron emission enhancement coating may be deposited at this time. If desired, the film can be selectively removed from the bonding surfaces by filling the trenches with resist.

The second wafer is oxidized in a high temperature furnace. If an electron emission enhancement coating is being used, it can be deposited onto the second wafer at this time. The second wafer is bonded face-to-face to the first, etched wafer, covering the length of the trenches to form channels which now are enclosed on four sides. In a preferred embodiment, the wafer will be direct bonded without adhesives, face-to-face to another wafer. The second wafer, generally referred to as a handle wafer, amy comprise a wafer with a MCP structure built on it by repeating the above steps. After optional annealling to strengthen the bond, the implanted wafer will be cleaved in-plane along the plane of the implant damage. Fracture in the implant plane can be initiated by ramping the temperature to greater than 500° C. during the anneal. Expansion of hydrogen filled microbubbles initiate microcracks, exfoliating the layer from the substrate. Mechanical crack initiation and propagation are also effective. Methods as simple as the insertion of a razor blade have been used to split off thin layers of single crystal silicon from hydrogen implanted wafers. A thin layer of silicon is now transferred to the handle wafer. Optionally, an etch stop layer may be deposited at the interface prior to bonding. The etch stop may be silicon nitride, a dopant diffusion or other technology.

The wafer now has buried channels. The channels lie in the plane of the wafer and have an oxide liner and an optional high secondary electron enhancement coating. The above steps are repeated to prepare the MCP structure. As few as 10 or 20 layers may provide benefits, and much larger stacks may readily be formed. The laminated wafer with completed in-plane channels may be cut with diamond or wire saw to expose channel ends. The MCP may be polished, and then cleaned to remove damage and debris from cut and polish. Exposed silicon on MCP faces may be oxidized. Oxide inside of channels may be densified by high temperature anneal if a chemical oxidation process was used. Electrodes then are deposited on MCP faces.

The technology for thin layer transfer by the Smart-Cut process, though new, is well established, and is entering a rapid growth phase in the production of SOI wafers. As discussed earlier, the process utilizes controlled cleavage propagation along a damage plane which has been created by hydrogen ion implantation. A thin layer is transferred to another substrate by the successive processes of ion implantation, wafer bonding and wafer splitting at the implant plane. This technology can be used with wafers which have MCP channels etched into the wafer surface. A robust bonding method to an etched surface or to a cleaved surface, and control of the debonding of a thin layer while maintaining the structural integrity of the etched channels, are needed.

Direct bonding, also called fusion bonding, does not use an adhesive. Since no foreign material is introduced at the interface, the management of intrinsic stresses is significantly improved over processes using a glue layer. Furthermore, thermal expansion mismatch does not exist, improving the reliability of the bonded structure. A further advantage of technique is that the bonded structure remains completely compatible with semiconductor processes. For example, if an organic adhesive were to be used, there severe limits would be placed on subsequent process options involving acids, bases, organic solvents, oxidizing plasmas or high temperatures. The tradeoff is more rigorous criteria on surface preparation. Surface roughness, organic contaminants and particles will all interfere with the ability to achieve a high quality bond.

The proposed process relies on the ability to form a high quality fusion bond with at least one of the surfaces being patterned with channels and/or being a surface which has been created by prior wafer cleavage. The issue of surface cleanliness is easily addressed by the well established RCA clean. The RCA clean is extremely efficient in the removal of particulates and other contaminants from silicon wafer surfaces, and it is the standard for preparation of wafer surfaces for fusion bonding. The issue of surface roughness needs to be carefully considered when bonding wafers which have undergone prior processing. The patterning process includes lithography, patterning of the etch mask which may be photoresist or it may be a hardmask such as silicon nitride, etching of the channels, and stripping of the etch mask. Each of these steps must be planned to maintain high surface quality in the bonding areas between the channels. The process flow for creating MCP channels is essentially the same as the process flow used in microelectronics for defining active areas and trench isolation. State of the art gate oxide thickness is about 35 Angstroms. The criteria for surfaces for gate oxide are even more rigorous than for wafer bonding, thus it is the process of bonding to a patterned surface may be acheivable. Furthermore, the presence of the trenches may allow some mechanical compliance in the bonding areas which will make bonding easier.

Since the MCP is to be built up by iterative processes of layer transfer and channel etch, it will be necessary to bond to surfaces which already undergone layer cleavage. The quality of the cleaved surface will be integral to strong bonding to that surface. Bruel has reported that the cleaved surface is nearly as smooth as that of a brand new wafer. In fact, one of the advantages of the Smart-Cut SOI manufacturing process is that the surfaces cleaved wafers is high quality and requires little or no preparation for device processing. The wafer which has donated the device layer to the handle wafer is used as the handle wafer for the next SOI wafer, apparently with no special surface preparation other than thermal oxidation. Likewise, it is expected herein that a cleaved surface may be bonded with oxidation only. Should the cleavage plane present an unreliable bonding surface, siloxane adhesion promoters may be used. These compounds can extend bonding capability by creating hydroxyl bond bridges. The hydroxyl groups can e eliminated as water in subsequent anneals, leaving only Si—O—Si bonds.

To debond the useful MCP layer from the support layer in the presence of buried channels, the cleavage plane should be prevented from climbing out of the implant region and into the channel plane. Further, the channels should be maintained free of any damage during the layer transfer. The debonding is accomplished by, for example, crack propagation. The crack may tend to propagate toward and through the buried etched channels or along the fusion bond interface if energy minimization can be achieved by doing so. Additionally, the corners of the channel profile may act as stress concentrators which act as dislocation sources under stress, essentially nucleating new and undesired microcracks. This issue can be addressed by optimizing the etch profile with respect to mechanical stresses. Again, this analogous to problems which have been already solved in the process flows for microelectronics. Methods are well established for stress reduction in shallow trench isolation through the use of corner rounding etches. Another reason that the crack may tend to propagate into the channels is that the voids created by the channels represent areas that have no atomic bonds, and thus the crack can propagate across the void with no energy requirement.

The global energy for cleavage in the void plane created by the channels would seem to be lower than for the implant plane in which the voids are much smaller. However, this does not account for the need to re-initiate the crack on the other side of the channel. Proper engineering of the channel cross-section will result in crack-tip blunting which raises the energy require to propagate within the channel plane. The cleavage can be contained within the implant damage plane by using a thermal cleavage process in which the pressure in the hydrogen-filled microvoids is increased by heating. It can be shown that the pressure inside of a gas-filled void is inversely proportional to the void diameter. By heating the bonded wafer pair to greater than 500° C., the pressure in the microvoids increases high enough to initiate cracks in the implant damage plane. By utilizing thermally driven cleavage (in comparison to mechanically driven) cleavage occurs globally within the implant damage plane all at the same time, and occurs preferentially at the small hydrogen-filled voids. In certain embodiments, the channels may be kept open to the ambient to prevent pressure build up.

In an alternative embodiment, the selective bonding techniques of copending U.S. patent application Ser. No. 09/950, 909 filed on Sep. 12, 2001 entitled "Thin films and Production Methods Thereof" may be used, which is incorporated herein by reference. In this alternative method, a first layer is selecteively bonded to a second layer. The selective bonding forms regions of weak bonding and regions of strong bonding. At the regions of weak bonding, the channels of desired cross section are formed in the first layer while supported by the second layer. After formation of the channels, the strong bond regions are subjected to ion implantation as described above. The weak bond regions may be protected from ion implantation by selective ion implatioation, or alteritively by masking the weak bond regions. After ion implantation, and optionally after controlled bubbling of the implated ions or particles, the entire first layer may be removed from the second layer and stacked as described above to form plural enclosed channels.

To form MCPs, the laminate must be cross-sectioned along the wafer face and perpendicular to the channel length. The thickness of cross-sections define the MCP channel length. The sections can be cut, for example by wire saw, diamond saw, laser cutting, or the like. The cross-sections can be further cut in the direction of the channel length to shape the MCP. If circular sections are desired, ultrasonic cutting may be employed. Because the microchannel plates are formed in the wafer plane, the number of plates per wafer is determined by the edge projection of the MCP onto the wafer surface.

Further, the channel geometries may be patterned to be funneling in one dimension. This will increase the mechanical strength of the MCP structure and improve the modulation transfer function by focusing the exiting electrons in one dimension.

As the gain enhancing layer on to each layer of MCP structure may be coated individually, the present method affords the choice of different coating methods and coating materials as opposed to other methods of making MCPs in which one has to coat the whole MCP structure at once through narrow openings of MCP channels. A wider material spectrum allows for better secondary emission by means of optimum surface treatment, leading to higher gain and higher saturation voltage. Also processing of the MCP structure, which is formed of $SiO_2$, can be undertaken at high temperature, which will reduce outgassing. This novel technology is inherently capable of smaller pitches and smaller channel exit openings, especially with funneling as described above.

Figure 8:
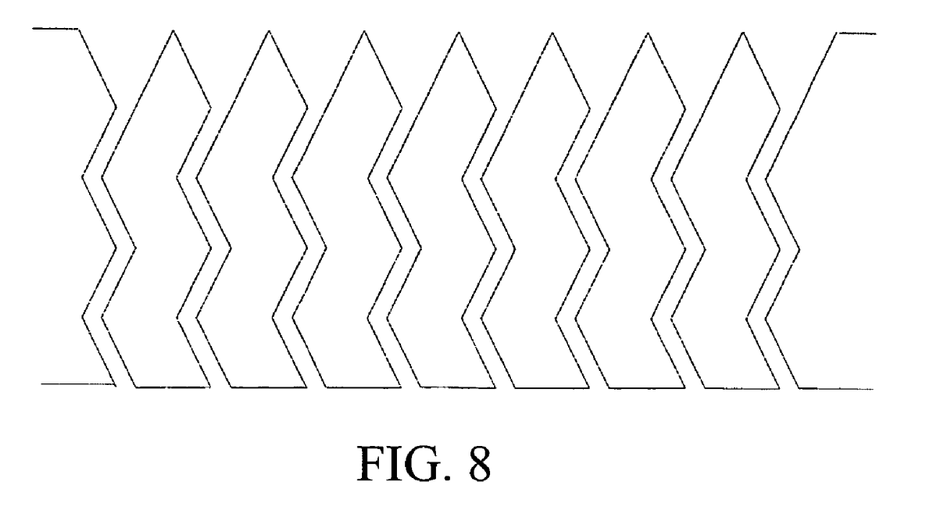
FIG. 8 shows an embodiment of a channel configuration.
Figure 9:
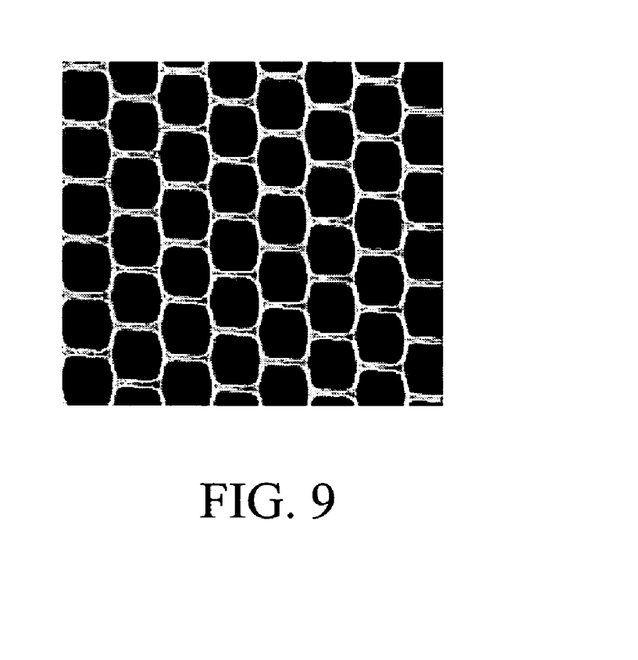
FIG. 9 shows another embodiment of a channel configuration.

Using automation in manufacturing techniques high-resolution MCPs may be produced by MFT process at low cost. Channels can be etched in silicon wafers horizontally using photolithography techniques. This type of processing of channels in two dimensions will allow us to make complex channel geometry. Channel geometry can be appropriately selected to optimize the properties of MCP, e.g., such as a chevron configuration as shown in FIG. 8, or a hexagonal pattern as shown in FIG. 9. Each individual channel can have geometry similar to a photomultiplier tube with funnel structure to collect incoming electrons and bent long tube to amplify the number of electrons, as shown in FIG. 8.

Silicon wafers for making silicon MCPs may be conventional silicon wafers. Wafer type and resistivity may be specified based on choice of etch process. Timed etching, or use of an etch stop layer, may be employed. Epitaxial wafers may also be used for etch stop using dopant selective etches. Other etch stops such as implant layers, interfacial deposited layers, and nitridation of the interface may be employed.

The wafers may be implanted with hydrogen to form a wafer cleavage plane. Larger channel dimensions generally require high energy implant (>400 keV). Cleavage requires a dose of approximately $5 \times 10^{16}$ cm$^{-2}$. To prevent blistering, wafer temperature must be controlled during ion implant either by aggressive backside cooling, or by use of low current.

Initial oxidation may be performed while trench is still open (before bonding cover wafer). This will oxidize the channel surfaces. Another oxidation may be performed after building the full MCP structure in order. While the horizontal aspect of the channel is exposed a coating may be deposited to serve as a secondary electron enhancement coating.

The disclosed structure will have following advantages. The need to have two MCPs in chevron configuration, as in conventional MCPs, is obviated. The channel geometry ensures that there is no feedback of photons from phosphor screen to photocathode and photoelectrons from photocathode always hit the walls of the MCP channels. Additionally, the MCP can have greater mechanical strength as most of the part of micro-channels is narrow with thick walls. Additionally, with the narrowing of channels in one dimension from initial funnel structure to crooked tubes, electrons will be focused in one dimension improving the modulation transfer function. Finally, as the mechanical strength of the MCP is not compromised by making the wall thickness in one of the dimensions to zero, the open area ratios may be higher. This will lower the noise figure.

Further, since etching is not through the thickness of the MCP, the MCP may be formed of any desired thickness. Thus very high aspect ratios may be attained, which is not possible in other techniques such as glass fiber MCP and silicon MCP in which one has to etch through the thickness of MCP structure. By increasing the aspect ratio, the gain of silicon MCP may be increased.

The disclosed MCPs are extremely useful for military applications (night vision goggles etc), space applications (Grazing-incidence telescopes for soft X-ray astronomy etc.) and commercial applications (Night vision consumer products for security and law enforcement etc.).

Figure 11:
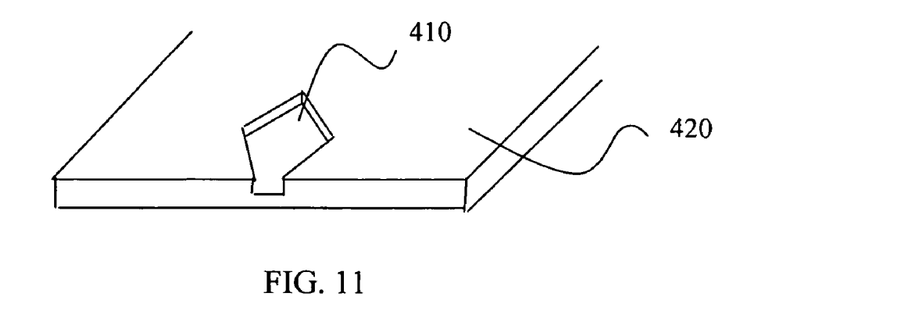
FIG. 11 shows a single microchannel in a schematic cross-section in accordance with the principles of the invention.
Figure 12:
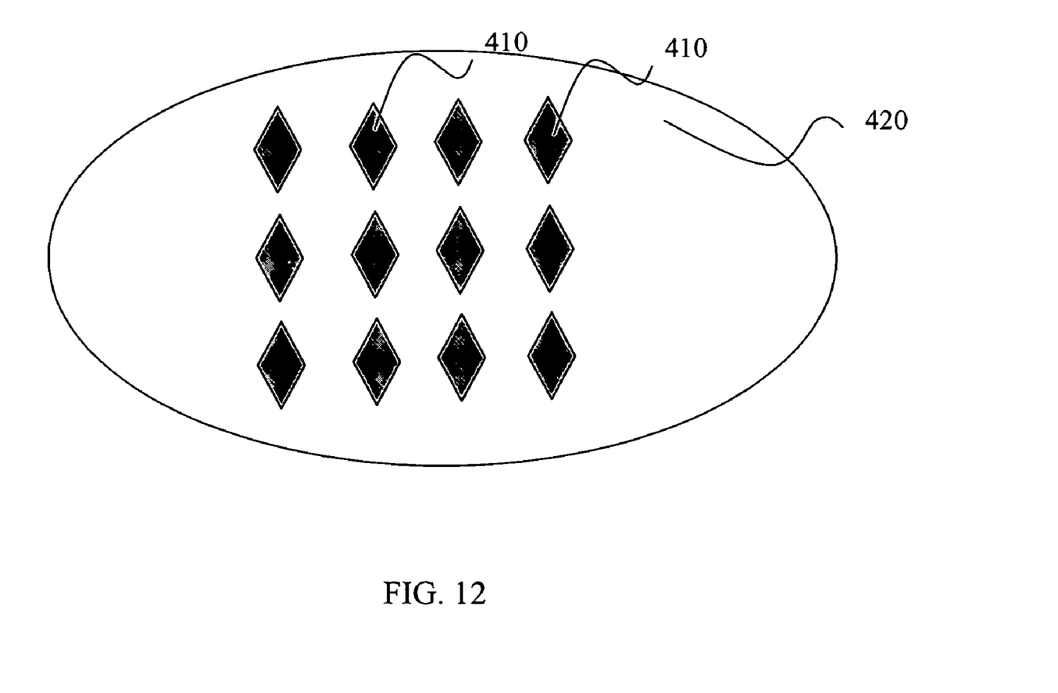
FIG. 12 shows a plurality of microchannels in a schematic cross-section in accordance with the principles of the invention.

In a preferred embodiment, referring to FIG. 11, there is shown a single channel 410 in a wafer 420. The single channel is preferably a diamond shape. Referring to FIG. 12, there is shown a plurality of such channels formed on a wafer 420. Silicon wafers for making silicon MCPs may be conventional silicon wafers. Wafer type and resistivity may be specified based on choice of etch process. Timed etching, or use of an etch stop layer, may be employed. Epitaxial wafers may also be used for etch stop using dopant selective etches. Other etch stops such as implant layers, interfacial deposited layers, and nitridation of the interface may be employed.

The wafers may be implanted with hydrogen to form a wafer cleavage plane. Larger channel dimensions generally require high energy implant (>400 keV). Cleavage requires a dose of approximately $5 \times 10^{16}$ cm$^{-2}$. To prevent blistering, wafer temperature must be controlled during ion implant either by aggressive backside cooling, or by use of low current.

Initial oxidation may be performed while trench is still open (before bonding cover wafer). This will oxidize the channel surfaces. Another oxidation may be performed after building the full MCP structure in order. While the horizontal aspect of the channel is exposed a coating may be deposited to serve as a secondary electron enhancement coating.

Figure 13:
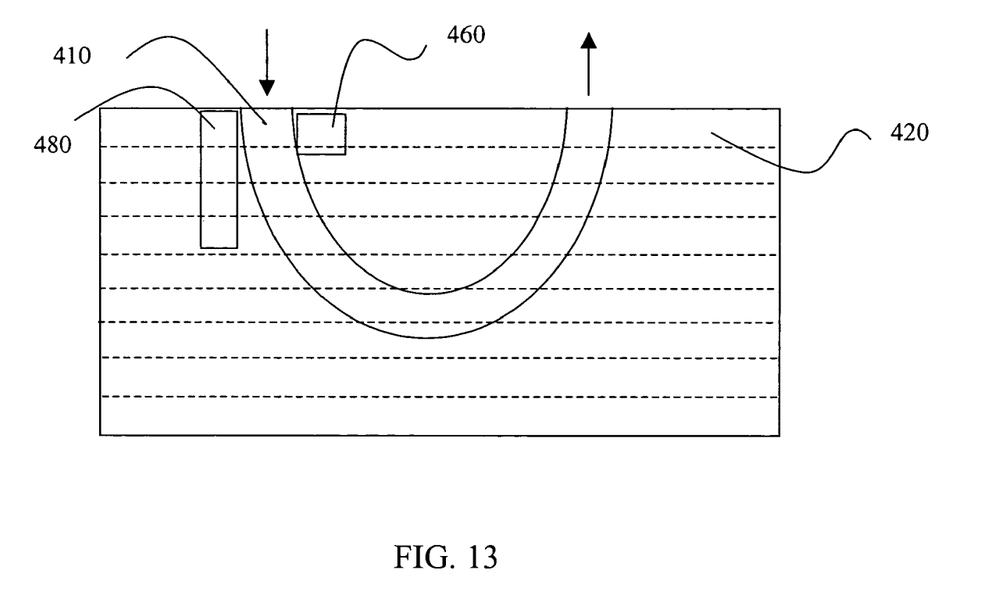
FIG. 13 shows a schematic cross-section diagram of a microchannel in accordance with the principles of the invention.

Referring to FIG. 13, there is shown a schematic cross-section diagram of a plurality of wafers 420 shaped to form a U-shaped microchannel 440. Such a shape, along with the diamond shaped individual microchannel 410 is advantageous in many respects. In conjunction with an electron accelerator 460 and electrodes 480, the spatial patterns at the output of the microchannel plate preserve distinctly the image entering the microchannel plate. The photons in the microchannel can accelerate around the apex of the U-shaped curve via the uniform field created by the electrode. An incident photon enters the microchannel and frees an electron from the channel wall and strike the channel surface to yield an exact replica of the pattern entering the microchannel.

One significant application of the disclosed MCPs are Biochip arrays. Biochip array technology is used for numerous applications in the biological sciences. Biochips are part of the high-throughput revolution in biotechnology that allow researchers to conduct hundreds if not thousands of nucleic acid hybridization based experiments in parallel. But Biochips are not without their limitations. Since they typically depend on fluorescent dyes as the signal for successful hybridization, the signal from a single hybridization event is far too weak to be detected easily. Thus, researchers are left with two choices: increase the amount of hybridization events or use sophisticated equipment to detect weak signals. In either scenario, this increases cost and adds time to the entire process; the very things a high-throughput Biochip array is suppose to reduce.

Biochip arrays are an array of hundreds if not thousands of different single stranded oligonucleotides, each in its own well. Hybridization occurs when a nucleic acid chain from the test sample finds its complementary strand in one of the wells. Fluorescence detection is the most popular method for Biochip arrays, which are used in most applications. To read the fluorescence from a Biochip array, researchers can either use photo multiplier tubes (PMT) or a charge coupled device (CCD) camera.

CCD is a well-established technology, but its sensitivity is typically far too weak for Biochip array reading. The fluorescence signal could be amplified with the use of more material (i.e. test samples attached with fluorescence dyes), but this necessitates an increase in the size of the Biochip wells and requires more time for complete hybridization. Thus, most researchers prefer the more sensitive PMT. Though PMT is sensitive, it requires the use of a confocal laser scanning system. This is very expensive ($50,000–$100,000) and thus limiting the general use of Biochip array technology. Resolution of the scanners is limited to a few microns. And since scanners can only detect one point at a time, the throughput of the overall system is very low. Finally, batch reading is not possible due to required adjustments of scanner settings for each array.

A low cost enhancement of the sensitivity and throughput of a detection system would greatly improve the functionality of the Biochip technology. Herein disclosed is a low cost method to increase the sensitivity and the resolution, and thus the overall throughput of the Biochip, by marrying a micro channel plate (MCP) with a CCD or CMOS imager. It is envisioned that the combined technology can achieve high sensitivity gain (perhaps up to a million fold), higher resolution (down to sub-micron levels), higher speed and throughput, and lower cost. The above described low cost MCP would make the present Biochip array feasible.

By marrying MCPs to a CCD, the above problems would be solved. A MCP would amplify the fluorescence signal so that a simple CCD can detect it without the need for increased material. However, conventional Micro Channel Plate technology relies on glass manufacturing techniques, which uses fiber drawing, stacking and redrawing, making it expensive and has reached its limits. Very little flexibility is currently available in picking the channel materials. Resolution is limited because etching of narrower channels becomes more difficult. Additionally, the total area of glass MCPs is limited. In another manufacturing method, silicon MCPs are made by electro-chemically etching channels in thin silicon wafers. In this technology higher resolution is difficult to achieve, as it becomes very difficult to etch narrower channels.

Figure 10:
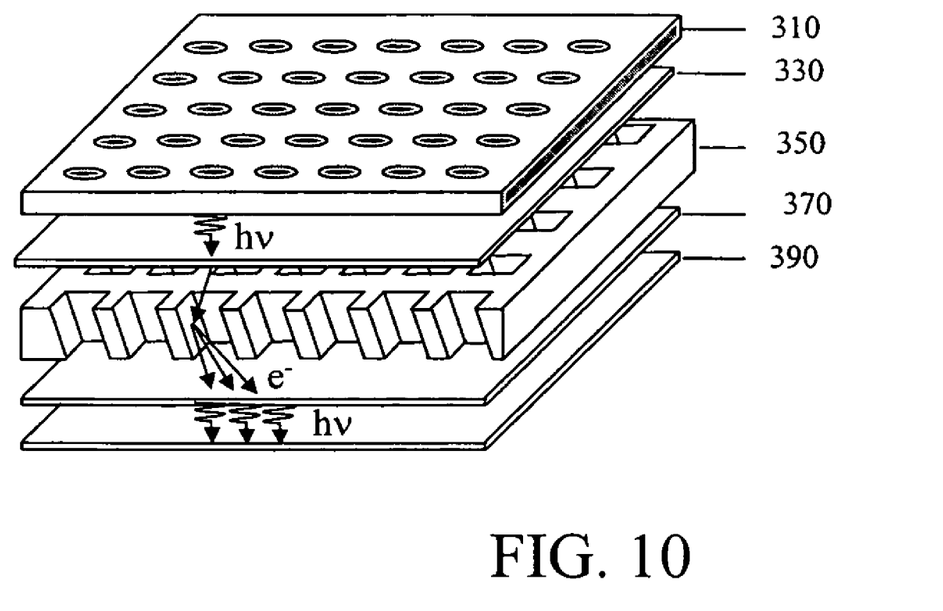
FIG. 10 shows a Biochip array in accordance with the principles of the invention.

Using the above described manufacturing process (for e.g., FIG. 7), however, MCPs may be made on a scale suitable for Biochip arrays. With the disclosed MCP structure, an image intensifier system may be integrated with a Biochip as shown in FIG. 10. The Biochip array 310 is stacked on top of a photocathode 330. The photocathode is supported by a microchannel plate 350 of the present invention. The microchannel plate is supported by a phosphor screen 370. Finally a CMOS/CCD array 390 for detection of the fluorescence signal.

In operation, when a labeled nucleic acid hybridizes with its complementary pair in one of the wells of a Biochip array, the well will give out a photon due to fluorescence. This photon will then hit the photocathode and in turn produce an electron. By applying a high voltage across the MCP, this electron will accelerate and enter the channel. This high velocity electron will now hit the side of the channel, thus producing an emission of many secondary electrons. These electrons will be further accelerated down and they will hit the wall of the channel generating even more electrons. Thus one electron will be multiplied into a shower of electrons, which finally will hit a phosphor screen generating many photons. A CCD can now easily detect this photon shower.

Alternatively, one can simplify this system and detect this shower of electrons using an array of electron detectors, eliminating the need for a phosphor screen and CCD camera. It is crucial that the channels of the MCP align perfectly with the wells of the Biochip array so that the signal from one well does not spill into a channel intended for a different well. This can be accomplished with the nano-alignment capabilities of MFT. Techniques like coincidence detection can also be employed to reduce the noise in the process.

The disclosed technology has all the advantages of a low cost CCD or CMOS, and avoids the more unreliable, mechanical nature of a scanning system. Using a MCP in conjunction with a CCD will potentially increase the sensitivity to detect photons a million fold owing to $10^6$ gain of MCP. Therefore, this system offers as much sensitivity, if not more, than the competing PMT system, without the cost. Because the detection is accomplished in parallel, this upholds the high throughput nature of the Biochip array. Since we can make MCP with sub-micron channel spacing, the wells of a Biochip array can also be sub-micron size. This allows more wells per square inch, as well as a further reduction in reagents and materials. With nano-fluidics, hybridization will occur much faster, thus allowing researchers to stop having to leave Biochips overnight to ensure complete hybridization.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A Biochip array device comprising:
a CCD array;
a phosphor screen supported by said CCD array;
a microchannel plate supported by said phosphor screen;
a photocathode supported by said microchannel plate; and
a biochip array supported by said photocathode.

2. The Biochip array device of claim 1 wherein said microchannel plate is aligned with said array of biochips.

3. The Biochip array device of claim 1 wherein said microchannel plate has sub micron spacing.

4. The Biochip array device of claim 1 wherein detection of fluorescent signals at the CCD array is accomplished in parallel.

* * * * *